United States Patent [19]

Sugimoto

[11] Patent Number: 4,578,668

[45] Date of Patent: Mar. 25, 1986

[54] DECODER FOR A D/A CONVERTER

[75] Inventor: Yasuhiro Sugimoto, Yokohama, Japan

[73] Assignee: Shibaura Denki Kabushiki Kaisha Horikawa Cho Sai Wia Kawasaki, Japan

[21] Appl. No.: 595,439

[22] Filed: Mar. 30, 1984

[30] Foreign Application Priority Data

Mar. 31, 1983 [JP] Japan .................................. 58-55963

[51] Int. Cl.[4] ............................................. H03M 1/76
[52] U.S. Cl. ........................................... 340/347 DA
[58] Field of Search .................. 340/347 DA; 358/21, 358/280

[56] References Cited

U.S. PATENT DOCUMENTS 4,250,492  2/1981  Yamakido et al. .......... 340/347 DA
4,539,553  9/1985  Takeda et al. ............... 340/347 DA

OTHER PUBLICATIONS

"10-Bit D/A Converter for Video," Technical Research Meeting Date of the Institute of Electronics and Communications of Engineers of Japan, Semiconductor and Transistor Subcommittee; SSD 82-1.

Primary Examiner—L. T. Hix
Assistant Examiner—David M. Gray
Attorney, Agent, or Firm—Finnegan, Henderson, Farabow, Garrett & Dunner

[57] ABSTRACT

A decoder for a D/A converter comprises at least two resistor circuits, two transistor circuits, three constant current sources and a plurality of switches where the plurality of switches respond to a digital input to connect certain of the constant current sources to certain of the resistors.

7 Claims, 6 Drawing Figures

DECODER FOR A D/A CONVERTER

BACKGROUND OF THE INVENTION

The present invention relates to a decoder for a D/A converter.

Figure 1:
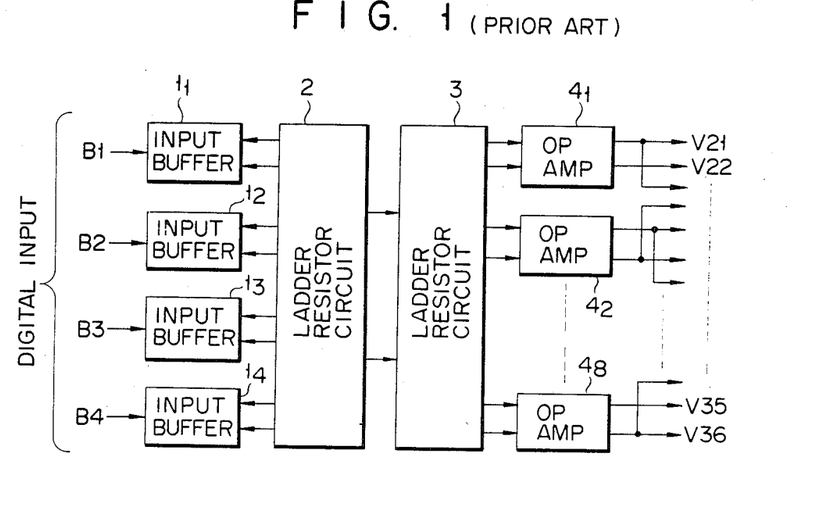
FIG. 1 shows a block diagram of a prior D/A converter.
Figure 2:
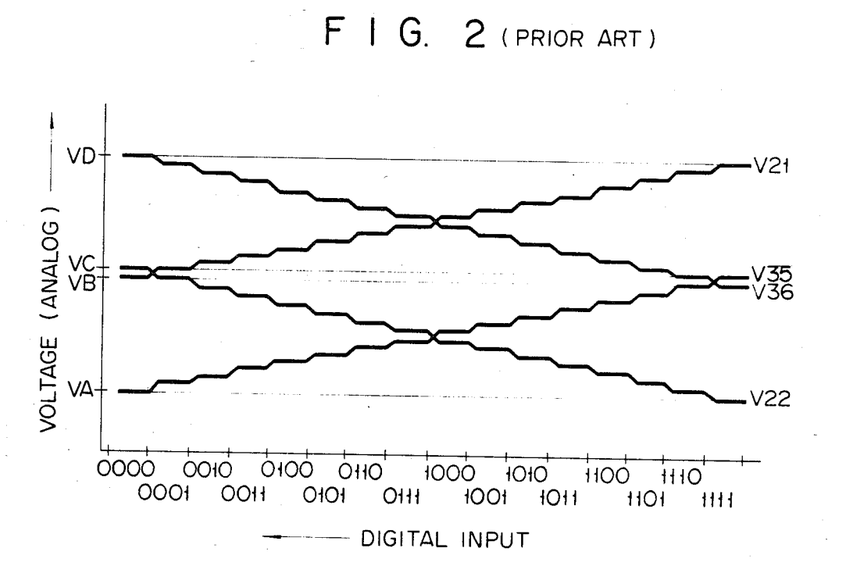
FIG. 2 shows a graphical representation of an input-output characteristic of the D/A converter shown in FIG. 1.

In a D/A converter used for digitally processing television signals, $(2^n-1)$ pairs of current sources and switches are provided in a parallel fashion for the digital input of n bits. The number of switches turned on is given by the digital expression of the digital input. A decoder is used for generating the bit data necessary for controlling the $(2^n-1)$ switches according to the n bit digital input. One of such decoders has been proposed in "The Institute of Electronics and Communication Engineers", vol. 82, No. 13, SSD 82-1. The proposed decoder is as shown in FIG. 1. An arrangement is provided which is composed of input buffers $1_1$ to $1_4$, first and second ladder circuits, and eight differential amplifiers $4_1$ to $4_8$. The 4-bit digital input B1 to B4 is converted into 16 analog signals by this arrangement. These converted signals are combined into a plurality of pairs. These paired signals are compared with every other pair and are held to have the logic "1" or "0" according to the result of the comparison.

In the above decoder, eight amplifiers $4_1$ to $4_8$ are used. Accordingly, the number of elements required is large enough to complicate the circuit construction, to increase the cost of manufacture, and to decrease the operation speed. When the digital input changes from (0000) to (1111), an analog signal changes from a level $V_B$ to a maximum level $V_D$, and another analog signal changes from a level $V_C$ to a minimum level $V_A$. Of these levels, the difference between the maximum and minimum levels is large, but the difference between the levels $V_B$ and $V_C$ is very small. Accordingly, when the power source voltage is low, it is very difficult to produce a level between them sufficient enough to compare the signals $V_{21}$ and $V_{22}$. Therefore, the efficiency when using the low power source voltage is poor.

SUMMARY OF THE INVENTION

Accordingly, an object of the present invention is to provide a decoder for a D/A converter which is simple in construction and which makes an efficient use of the power source voltage.

According to the invention, a decoder for a D/A converter comprises a first and second resistor circuit, first and second transistor circuits, first, second, and thrid constant current sources and a plurality of switches.

The first resistor circuit for D/A conversion is connected between a first power source and a second power source and is made up of a series resistor path including a plurality of resistors between the first and second power sources, one end of the series resistor path being connected to the first power source and the other end thereof forming a voltage output terminal.

The first constant current source contains a plurality of constant current sources which are respectively associated with the resistors in the first resistor circuit and connected between the resistors and the second power source.

The plurality of switches are provided between the plurality of resistors in the first resistor circuit and the constant current sources in the first constant current source circuit, the switches respectively receiving digital input signals to selectively connect the resistors in the first resistor circuit to the first constant current sources according to the state of the logic of said digital input signal.

The first transistor circuit includes a transistor the base of which is connected to said voltage output terminal of the series resistor path and the output path of which is connected at one end to said first power source.

The second constant current source circuit includes a constant current source connected between the other end of the output path of the transistor in the first transistor circuit and the second power source.

The second transistor circuit includes a transistor the base of which is connected to the first power source and the output path of which is connected at one end to the first power source.

The second resistor circuit for reference voltage generation is provided between the other end of the output path of the transistor in the second transistor circuit and the second power source, the second resistor circuit including a series resistor path including a plurality of resistors connected in series between the other end of the output path and the second power source.

The third constant current source circuit includes a constant current source connected between the series resistor path of the second resistor circuit and the second power source.

In the decoder of this invention the first resistor circuit may include first and second series resistor paths, and the plurality of switches selectively select, according to logical states of the digital input signals applied thereto, the corresponding resistors in said first or second series resistor path and connect them to the corresponding constant current sources in said first constant current circuit. The first transistor circuit may also include first and second transistors of which the bases are connected to the voltage output terminals of said first and second series resistor paths and the second constant current source circuit may include first and second constant current sources respectively connected to said first and second transistors in said first transistor circuit furthermore, the second resistor circuit may include first and second series resistor paths.

DETAILED DESCRIPTION OF THE PREFERRED EMBODIMENTS

1. 1st Embodiment

1.1 Configuration

Figure 3:
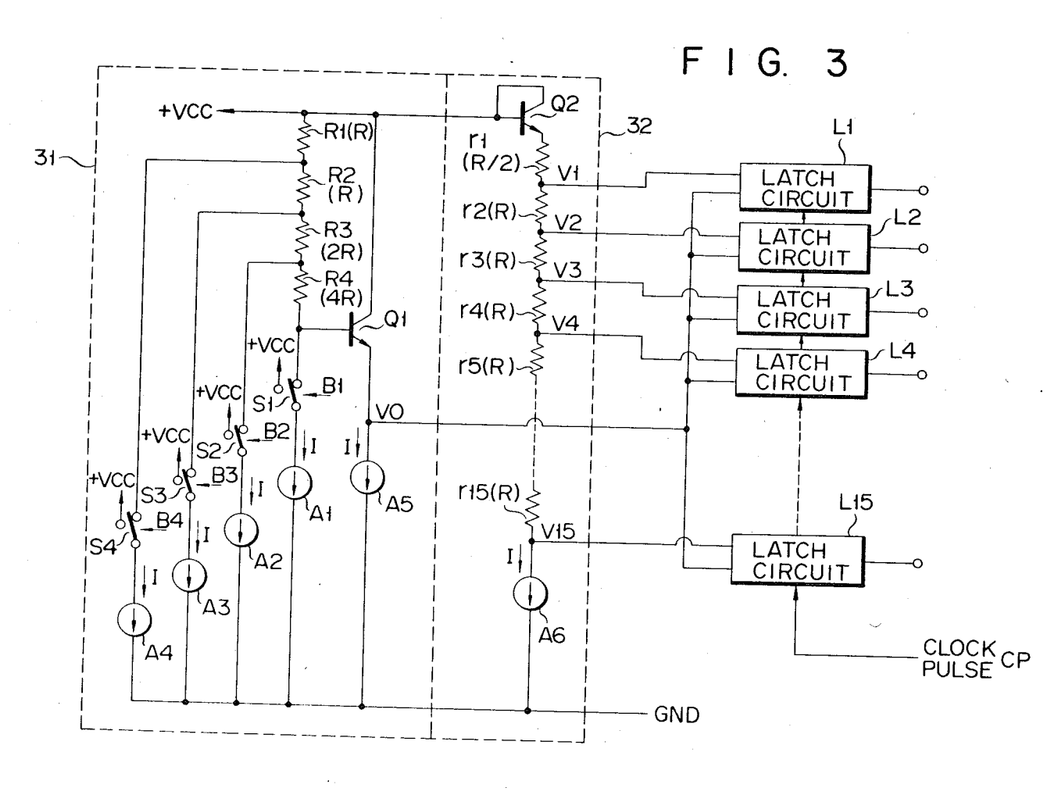
FIG. 3 illustrates in schematic and block form a decoder for a D/A converter which is an embodiment according to the present invention.

Reference is made to FIG. 3 illustrating a first embodiment of a decoder for a D/A converter according to the present invention. The decoder decodes digital inputs of 4 bits B1 to B4 into 16 ($2^4$) bit data. In the figure, reference numeral 31 designates a D/A converter using series connected resistors, numeral 32 designates a reference voltage generating circuit using seires connected resistors, and L1 to L15 designate compare/hold latch circuits. The D/A converter 31 comprises: current switches S1 to S4 controlled according to the logic levels of the received digital inputs B1 to B4; constant current sources A1 to A4 for feeding the constant currents I; resistors R1 to R4 of resistances R, R, 2R and 4R ($=2^2 R$), respectively; and an NPN transistor Q1. The transistor Q1 is connected at the collector to a positive power source +Vcc, at the emitter to a reference power source voltage, or ground, via the constant current source A1.

Resistors R1 to R4 are series connected in this order between the +Vcc and the base of the transistor Q1. The junction between the resistor R4 and the base of the transistor Q1 constitutes an output terminal for the voltage across the resistor series circuit R1 to R4. The base of the transistor Q1 is also connected to ground GND through the switch S1 and the constant current source A1. The junction between the resistors R3 and R4 is connected to the switch S2 and the constant current source A2. The junction between the resistors R2 and R3 is connected to the ground GND through the switch S3 and the constant current source A3. Similarly, the junction between the resistors R1 and R2 is connected to ground GND via the switch S4 and the constant current source A4.

The reference voltage generating circuit 32 comprises: an NPN transistor Q2; a series of resistors r1 to r15 with resistances R/2, R, ... R; and a constant current source A6 for feeding a constant current I. The transistor Q2 is connected to the +Vcc. The collector and the base thereof are interconnected with each other. The emitter of the transistor Q2 is connected to the ground GND via a route consisting of the resistor series circuit r1 to r15 and the constant current source A6. Voltage Vo as output voltage from the D/A converter 31 is derived from the emitter of the transistor Q1. Voltages V1 to V14 are derived from the junctions between the adjacent resistors in the resistor series circuit, and voltage V15 is derived from the junction between the resistor r15 and the constant current source A6.

The output voltage Vo of the D/A converter 31 and the output voltages V1 to V15 from the reference voltage generating circuit 32 are respectively coupled with the first and second paired input terminals of the latch circuits L1 to L15, as shown. A clock pulse CP times the operation of the latch circuits L1 to L15.

1.2 Operation

Figure 4:
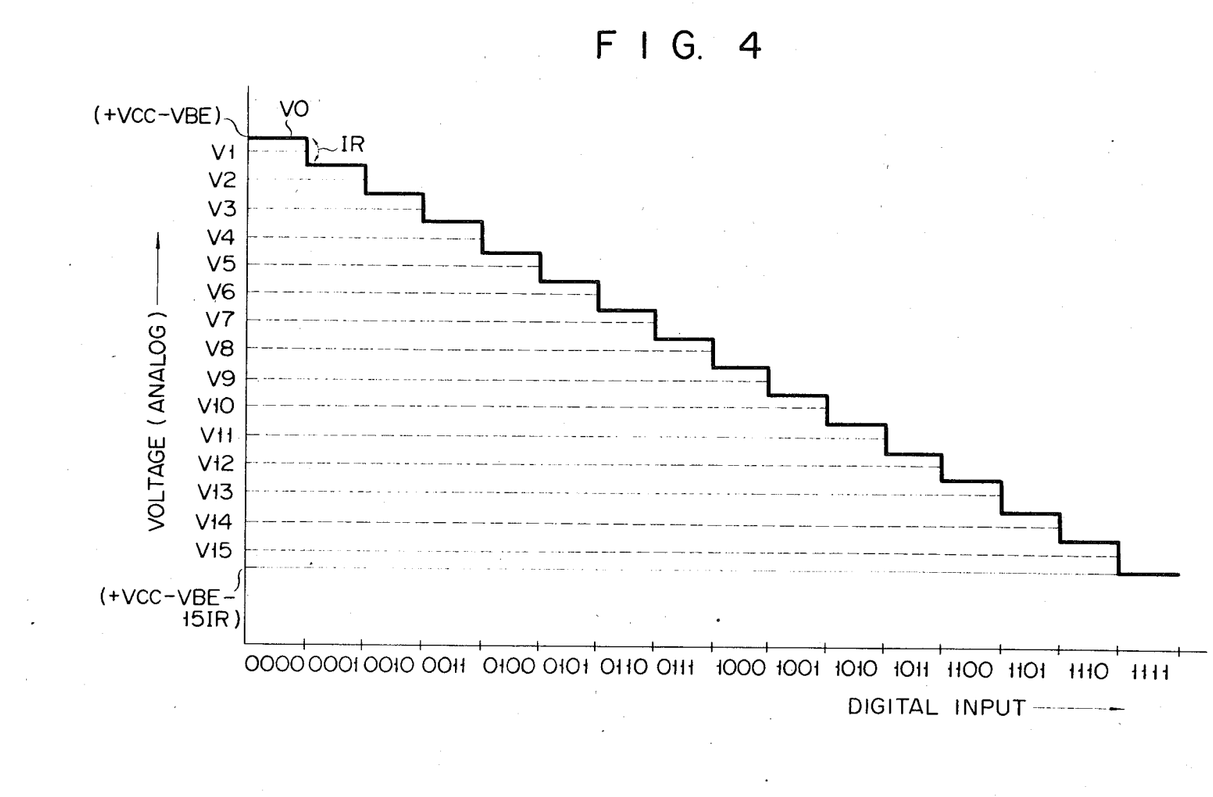
FIG. 4 shows a graphical representation of an input-output characteristic of the decoder of FIG. 3.

The operation of the encoder for a D/A converter thus arranged will be described further referring to FIG. 4 illustrating a relationship between the voltages VO and V1 to V15 with respect to the digital input signal.

The switches S1 to S4 respectively select the corresponding resistors R1 to R4 when the digital input B1 to B4 has a logic value of "1", and select respectively the +Vcc potential when the input has a logic of "0". Accordingly, the constant current sources A1 to A4 are respectively connected to the resistors R4 to R1 when the input is "1", and are connected to the +Vcc potential. As shown, the voltage VO output from the D/A converter 31 stepwise changes as indicated by the solid line in FIG. 4 against a change of the digital input from (0000) to (1111). The potential difference of one step in the stepwise change of the output voltage VO is IR. If the base-emitter voltage of the transistor Q1 is $V_{BEQ1}$, the output voltage VO for the digital input (0000) is $+Vcc - V_{BEQ1}$.

The reference voltages V1 to V15 from the reference voltage generating circuit 32 are as indicated by the dotted lines in FIG. 4. As shown, the reference voltages V1 to V15 are each positioned at the midpoint of the potential difference IR of each step in the output voltage VO stepwise change which ranges from (0000) to (1111), viz. half of each one step potential difference IR. Thus, the reference voltage generating circuit 32 produces reference voltages V1 to V15 which correspond to half of the one step voltage differences of the output voltage VO of the D/A converter 31. More specifically, the reference voltage V1 is equal to the difference between the +Vcc, and the sum of the base-emitter voltage $V_{BEQ2}$ of the transistor Q2, the one step potential difference IR, and $+Vcc - (V_{BEQ2} + 0.5\ IR)$. The currents of the constant current sources A5 and A6 are equal to each other at I, as already mentioned. If it is assumed that the transistors Q1 and Q2 have the same characteristics. Then, we can express:

$$V_{BEQ1} = V_{BEQ2} = V_{BEQ}$$

Hence, the reference voltage V1 is :

$$+Vcc - V_{BEQ} - 0.5 IR$$

This expression describes that the reference voltage V1 is equal to half of the one step potential difference of the output voltage Vo when the voltage Vo changes from $(+Vcc - V_{BEQ})$ to $(+Vcc - V_{BEQ} - IR)$ as the digital input changes (0000) to (0001). Further, the reference voltage V3 is:

$$+Vcc - V_{BEQ} - 2.5 IR$$

This likewise describes that the voltage V3 is half of the one step potential difference when the output voltage VO changes from $+Vcc - V_{BEQ} - 2IR$ to $+Vcc - V_{BEQ} - 3IR$ as the digital input changes from (0010) to (0011). Analogously, the lowest reference voltage V15 for the digital input (1111) is:

$$+Vcc - V_{BEQ} - 14.5 IR$$

The lowest output voltage VO for the digital input (1111) is:

$$+Vcc - V_{BEQ} - 15 IR$$

The latch circuits L1 to L15 compare respectively the reference voltages V1 to V15 with the output voltage VO in synchronism with the clock pulse input CP and latch logical state "0" or "1" according to the result of the comparison. Specifically, when the output voltage Vo of the D/A converter 31 is $+V_{cc}-V_{BEQ}-3IR$, the latch circuits L1 to L3 having the reference voltages ($+V_{cc} -V_{BEQ}-0.5IR$), V2 ($+V_{cc}-V_{BEQ}-1.5IR$), and V3 ($+V_{cc} -V_{BEQ}-2.5IR$) smaller than the output voltage Vo, V1 latch logic "1", while the remaining ones L4 to L15 latch logic "0". It is noted here that the input voltage to the latch circuits L1 to L15 is not less than the minimum level ($+V_{cc} -V_{BEQ}-15IR$), and is not larger than the maximum level ($+V_{cc} -V_{BEQ}$). Therefore, the change in the level of the input voltage V1 to V15 to the latch circuits is within 15 IR $\{(+V_{cc} -V_{BEQ})-(+V_{cc} -V_{BEQ1}-15IR)=15IR\}$. This range is within the output voltage VO.

1.3 Effects

The encoder according to the present invention requires no operational amplifiers which are essential to the prior art. This brings about the simplification of the circuit construction, the improvement of the operating speed performance, and the reduction of manufacturing costs. The change in the range of the level of the input voltages to the latch circuits is within that of the output voltage VO of the D/A converter 31. This feature improves the efficiency as it use the output voltage VO of the D/A converter 31. The potential difference 0.5 IR is selected between the two input voltages, the output voltage VO, and the reference voltage V1 to V15. The power source voltage can be small enough to the extent that it can be detected.

2. 2nd Embodiment

2.1 Configuration and Operation

Figure 5:
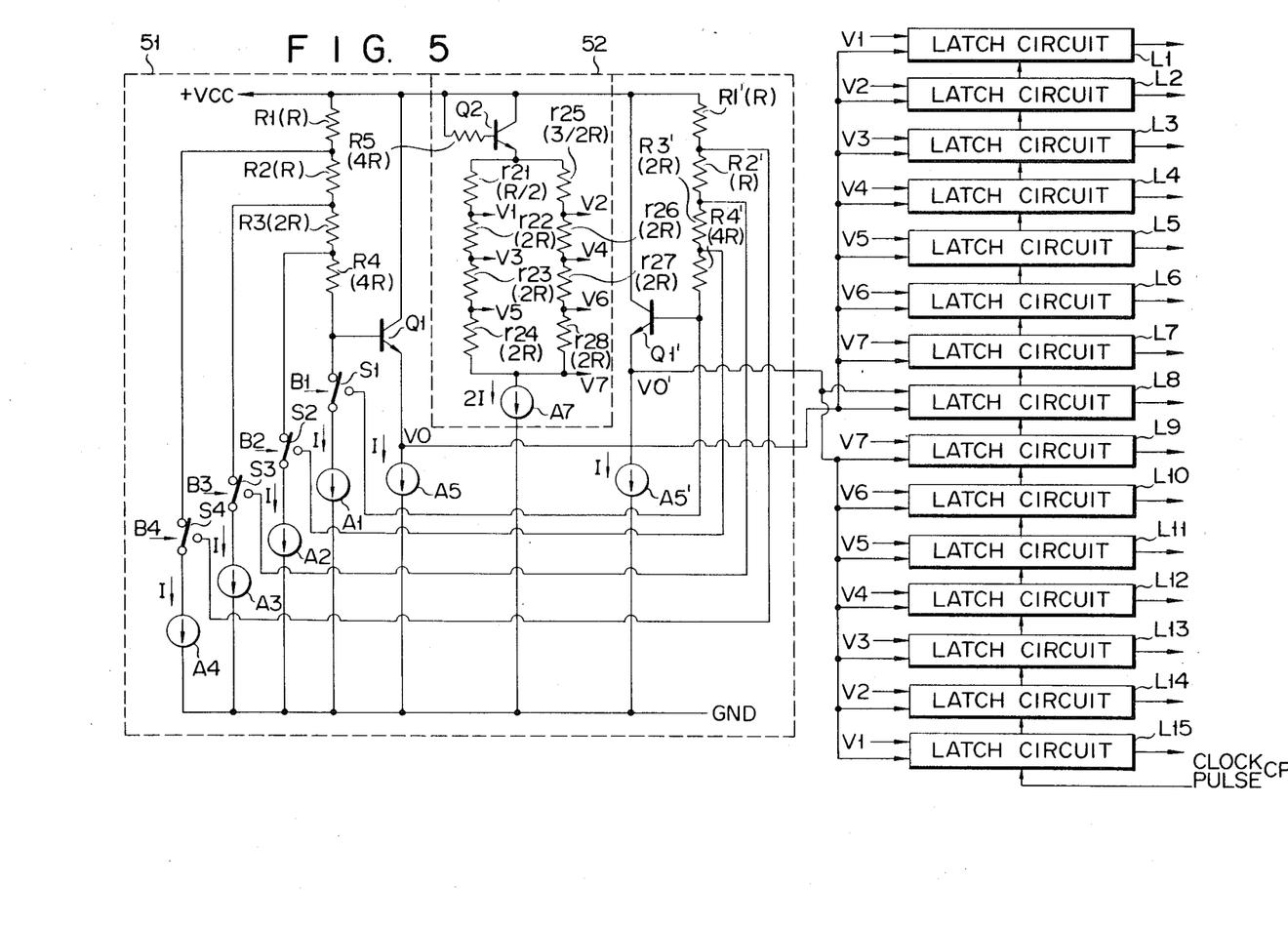
FIG. 5 illustrates, in schematic and block form, a decoder for a D/A converter which is a second embodiment according to the present invention.

FIG. 5 shows another embodiment of a decoder for a D/A converter according to the present invention. In the figure, like reference symbols are applied to designate like or equivalent portions in FIGS. 3 and 4. The second embodiment is distinguished from the first embodiment in the following. A D/A converter 51 contains the D/A converter 31 in FIG. 3 and additionally contains an arrangement that an NPN transistor Q1′, a series of resistors R1′ to R4′ having respectively resistances R to 2R, and a constant current source A5′ for feeding current I. These components in this arrangement respectively correspond to those in that of the first embodiment. In this arrangement, the collector of the transistor Q1′ is connected to +Vcc. The collector of the same is connected to the ground GND, through the constant current source A5′. The resistors R1′ to R4′ are inserted in series between +Vcc and the base of the transistor Q1′ which is further connected to one of the fixed contacts of the switch S1. Junctions between the adjacent resistors R1′ to R4′ are respectively connected to the fixed contacts of the remaining switches S2 to S4. These fixed contacts of the switches are connected together to the +Vcc in the first embodiment.

Figure 6:
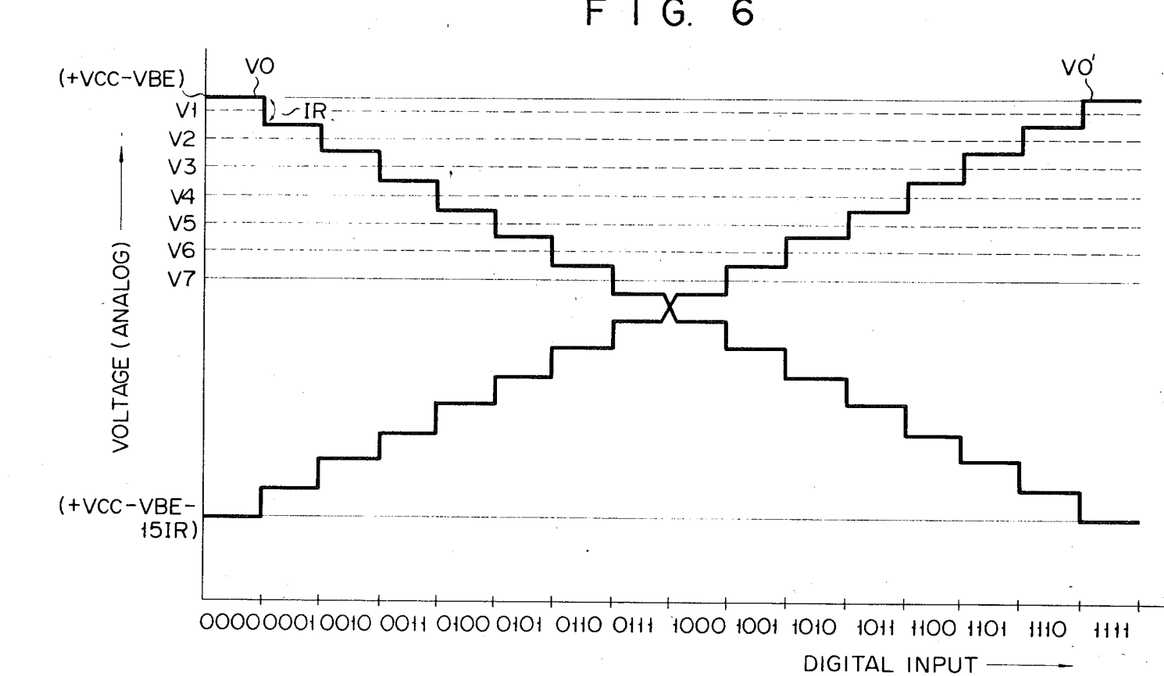
FIG. 6 illustrates a graphical representation of an input-output characteristic of the decoder shown in FIG. 5.

Further, in the above embodiment, the other fixed contacts of the switches are respectively connected to the junctions between the adjacent resistors R1 to R4, as you may recall. With this arrangement according to the state of the logic of the digital input B1 to B4, the switches S1 to S4 respectively set the movable contacts to either of the fixed contacts, viz. the switches select the potential or voltage dropped by each of the resistors R1 to R3 or R1′ to R3′. More specifically, the switches S1 to S4 respectively select the resistors R1 to R4 when the digital inputs B1 to B4 are "1", and when the inputs of the resistors R1′ to R4′ are "0". The selected resistors respectively are coupled with the constant current sources A1 to A4 and are fed with the constant current I. With such an arrangement, the transistor Q1 produces an output voltage Vo stepwise decrementing from (0000) to (1111) of the digital input, as shown in FIG. 6. Similarly, the transistor Q1′ produces an output voltage VO, stepwise incrementing from (0000) to (1111).

A reference voltage generating circuit 52 is composed of: an NPN transistor Q2; a compensating resistor R5 having a resistance 4R; a first series resistor circuit including resistors R21 to R24; and a second series resistor circuit including resistors r26 to r28. Both the series resistor circuits are connected in parallel, and a constant current source A7 feeds the current 2I. The resistor R5 compensates for an error voltage which can occur in the output voltages Vo and Vo′ due to a variation of the circuit constants in the route which includes the resistors R1 to R4 and the transistor Q1, and another route which includes the resistors R1′ to R4′ and the transistor Q1′. Both routes provide voltage drops. The employment of parallel connection in the two series resistor circuits is done to minimize the influence of the base current of the transistor upon the potential at the voltage comparing point in each latch circuit L1 to L15 to be described later. The transistor Q2 is connected to the collector to the +Vcc, and one end of the compensating resistor R5, and also to one end of the resistor R1′ and the collector of the transistor Q1′ in the D/A converter 51. The emitter of the transistor Q2, whose base is connected to the other end of the compensating resistor R5, is connected to a junction between the two series resistor circuits connected to each other in a parallel fashion. The other junction of the parallel connected series resistor circuits is connected to the ground through the constant current source A7.

The reference voltages V1, V3 and V5 are respectively derived from junctions between the adjacent resistors r21 to r24 in the first series resistor circuit. V2, V4 and V6 are respectively derived from the junctions between the adjacent resistors r25 to r28. The smallest reference voltage V7 is derived from the junction among the resistors r24 and r8, and the constant current source A7. Those reference voltages V1 to V7 are respectively given by ($+V_{cc} -V_{BEQ}-0.5IR$), ($+V_{cc}-V_{BEQ}-1.5IR$), ($+V_{cc}-V_{BEQ}-2.5IR$), ($+V_{cc}-V_{BEQ}-3.5IR$), ($+V_{cc}-V_{BEQ}-4.5IR$), ($+V_{cc}-V_{BEQ}-5.5IR$), and ($+V_{cc}-V_{BEQ}-6.5IR$). This is obtained from the circuit arrangement related through a similar process in the first embodiment and the graph of FIG. 6.

Those reference voltages V1 to V7 are applied to the input terminals of the two groups of latch circuits L1 to L8 and L9 to L15, as shown. The output voltage VO from the transistor Q1 is applied to the other input terminals of the latch circuit group L1 L8, and to the output voltage VO′ is applied to the other input terminals of the other latch circuit group L9 to L15. As in the first embodiment, the reference voltages V1 to V7 are each equal to half of the potential difference of one step in the stepwise incrementing curve of VO′ and of the stepwise decrementing curve of VO′ which are plotted with respect to the state of the change in the logic of the digital input signal from (0000) to (1111).

In operation, the latch circuits L1 to L15 each compares the two inputs and latch a logic of "1" or "0"

according to the result of the comparison. This operation is timed by the clock pulse CP.

2.2 Effects

The second embodiment needs only seven reference voltages for the fifteen used in the first embodiment. Further, the range of the change in the level of the input voltages to the latch circuits L1 to L15 is within the output voltage VO or VO' from the D/A converter 51 and corresponds to the range of the digital input (0000) to (0111). This feature further enhances the efficient use of the power source voltage, when compared with the first embodiment. The second embodiment also needs no operational amplifiers. In this respect, the circuit arrangement is simplified as a smaller number of circuit components is required.

2.3 Modification

It is evident that the power source voltage $+V_{cc}$ may be replaced by a negative power source $-V_{EE}$. In this case, the ground level is applied to a $+V_{cc}$ terminal as in the above embodiments, and a negative power source voltage $-V_{EE}$ is applied to the ground terminal. Further, the conductivity type, or NPN type, of the transistors Q1, Q1' and Q2 may be replaced by a PNP type. Additionally, the emitter and the collector of each transistor may be interchanged with each other.

While the described emdodiments represent the preferred forms of the invention, it is to be understood that modifications will occur to those skilled in the art without departing from the spirit of the invention. The scope of the invention is therefore to be determined solely by the appended claims.

What is claimed is:

1. A decoder for a D/A converter which is responsive to digital input signals comprising:

a first resistor circuit for D/A conversion connected between a first power source and a second power source, said first resistor circuit including a first series resistor path constituting a plurality of first resistors connected in series, a first end of said first series resistor path being connected to said first power source and a second end of said first series resistor path forming a first voltage output terminal;

a first constant current source circuit containing a plurality of constant current sources which are each associated with a different one of said first resistors in said first resistor circuit and coupled to said associated resistor and said second power source;

a plurality of switches each connected between a different one of said first resistors in said first resistor circuit and said associated constant current sources in said first constant current source circuit, said switches each receiving a different one of said digital input signals to selectively connect said first resistors to said associated first constant current sources according to the logic state of the corresponding digital input signal;

a first transistor circuit including a first transistor having a base connected to said first voltage output terminal of said resistor path and having an output path which is connected at one end to said first power source;

a second constant current source circuit including a second constant current source connected between the other end of said output path of said first transistor and said second power source;

a second transistor circuit including a second transistor having a base connected to said first power source and to one end of an output path;

a second resistor circuit for reference voltage generation provided between the other end of said output path of said second transistor in said second transistor circuit and said second power source, said second resistor circuit including a second series resistor path including a plurality of second resistors connected in series between said other end of said second transistor output path and said second power source; and a third constant current source circuit including a third constant current source connected between said second series resistor path of said second resistor circuit and said second power source.

2. The decoder according to claim 1, in which said first resistor circuit also includes a third series resistor path, said third series resistor path including a plurality of third resistors connected in series with said first power source and a second voltage output terminal, wherein each of said plurality of switches is also associated with a different one of said third resistors and connect, according to logical states of the digital input signals applied thereto, the associated resistors in said first or third series resistor path to the corresponding one of said first constant current sources in said first constant current circuit, wherein said first transistor circuit also includes a third transistor, said first and third transistors having bases respectively connected to the first and second voltage output terminals of said first and third series resistor paths, and wherein said second constant current source circuit also includes a fourth constant current source, said second and fourth constant current sources being respectively connected to said first and third transistors in said first transistor circuit, and wherein said second resistor circuit includes said second series resistor path and a fourth series resistor path in parallel.

3. The decoder according to claim 1, in which said the base of second transistor in said second transistor circuit is connected to said first power source via a compensating resistor.

4. The decoder according to claim 1, in which a plurality of resistors forming said first series resistor path in said first resistor circuit have resistances R, R, $2^1$R, $2^2$R, ..., respectively, in order from said first power source, wherein the switch controlled by the most significant bit of said digital input signal is associated with a first resistor in said first series resistor path which is located closest to said first voltage ouput terminal, and the other of said switches are controlled by the lower bits of said digital input signal are each associated with a different one of said first resistors located farther from said voltage output terminal;

wherein the plurality of said second resistors forming said second series resistor path of said second resistor circuit have values R/2, R, R, ..., respectively in order from the second transistor circuit, and wherein said first through third constant current sources in said first to third constant current source circuits generate equal currents.

5. The decoder according to claim 2, in which the plurality of said first resistors which form said first series resistor path of said first resistor circuit have resistances R, R, $2^1$R, $2^2$R, ..., respectively in order from said first power source,
  wherein the plurality of said second resistors which form said third series resistor path in saiq first resistor circuit have resistances R, R, $2^1$R, $2^2$R, ... respectively in order from said first power source;
  wherein said switch controlled by the most significant bit of said digital input is associated with a first resistor located closest to said first voltage output terminal, and the switches controlled by the lower bit signals of said digital input are located farther from said first voltage output terminal,
  wherein the plurality of said second resistors, which form said second series resistor path in said second resistor circuit have resistances R/2, 2R, 2R, ..., respectively in order from said second transistor circuit,
  wherein the plurality of said fourth resistors, forming said fourth series resistor path in said second resistor circuit have resistances 3/2R, 2R, 2R, ..., in order from said second transistor circuit side, and
  wherein said first and second constant current sources of said first and second constant current source circuits generate equal currents I, and the constant current source of said third constant current source circuit generates a current 2I.

6. The decoder according to claim 1, in which said first and second transistors are of NPN type.

7. The decoder according to claim 1, in which said first transistor of said first transistor circuit and said second transistor of said second transistor circuit are both of PNP type.

* * * * *

UNITED STATES PATENT AND TRADEMARK OFFICE
CERTIFICATE OF CORRECTION

PATENT NO. : 4,578,668
DATED : March 25, 1986
INVENTOR(S) : YASUHIRO SUGIMOTO

It is certified that error appears in the above-identified patent and that said Letters Patent is hereby corrected as shown below:

On the front page of the patent please change the assignee to -- Tokyo Shibaura Denki Kabushiki Kaisha, Kawasaki, Japan --; and Claim 5, change "saiq" to -- said --.

Signed and Sealed this

Twenty-fifth Day of November, 1986

*Attest:*

DONALD J. QUIGG

*Attesting Officer*      *Commissioner of Patents and Trademarks*